Jan. 15, 1963 T. H. STEARNS ET AL 3,074,043

PRINTED CIRCUIT AUTOMOTIVE DASHBOARD

Original Filed Feb. 10, 1958

Thomas H. Stearns
Thomas A. Nalette
INVENTORS

Robert O. Richardson
ATTORNEY 3,074,043

PRINTED CIRCUIT AUTOMOTIVE DASHBOARD

Thomas H. Stearns, Wilton, and Thomas A. Nalette, Nashua, N.H., assignors to Sanders Associates, Inc., Nashua, N.H., a corporation of Delaware Original application Feb. 10, 1958, Ser. No. 714,401, now Patent No. 3,009,010, dated Nov. 14, 1961. Divided and this application May 11, 1961, Ser. No. 109,302
4 Claims. (Cl. 339—148)

This invention relates to a printed circuit automotive dashboard wiring harness. This application is a division of our co-pending application printed circuit automotive dashboard, Serial No. 714,401, which was filed February 10, 1958, now Patent No. 3,009,010, issued November 14, 1961.

The most common practice in wiring instrument panels has been the use of a conventional wiring harness made up of a tightly-bound cluster of conductors having branch conductors spliced thereto. Although this arrangement provides a rather rugged assembly, it does have several disadvantages. Among these are the number of manual operations involved in the production of such an assembly, the poor appearance of the finished assembly, and the difficulty of tracing and repairing a failure in the system. A principal disadvantage of such an installation is that it tends to be heavy and lacks flexibility. While modern manufacturing techniques have minimized some of these disadvantages, there is still a need for a wiring harness that will lend itself to simplified installation and servicing. The present invention is directed to an improvement in the art of printed circuitry by providing a solution to the above-mentioned problems. While the invention is subject to a wide range of harness wiring applications, it is especially suited for use in automotive dashboard wiring and for convenience, will be particularly described in that connection.

It is an object of this invention, therefore, to provide in printed circuit form an improved unitary automotive dashboard wiring harness.

Another object of this invention is to provide an improved printed circuit automotive dashboard wiring harness having terminals integrally formed with the conductors.

A further object of the present invention is to provide an inexpensive printed circuit automotive wiring harness.

An additional object of the present invention is to provide a printed circuit automotive dashboard wiring harness of light weight and improved flexibility.

Another object of the present invention is to provide a printed circuit automotive dashboard wiring harness embodying a simplified, inexpensive terminal design.

In accordance with the invention, the automotive dashboard wiring harness comprises a unitary, flat circuit having a planar main conductor of uniform thicknesss. The conductor is encapsulated within a plastic insulating material and is proportional in width to the maximum current load. A plurality of branch conductors divide out of the main conductor and are integrally formed with and extend from the main conductor to provide a predetermined circuit configuration. Integrally formed with the branch conductors are terminals adapted for use in making solderless connections to the electrical apparatus of the automotive dashboard.

For a better understanding of the present invention together with other and further objects thereof, reference is made to the following description taken in connection with the accompanying drawings and its scope will be pointed out in the appended claims.

Figure 1:
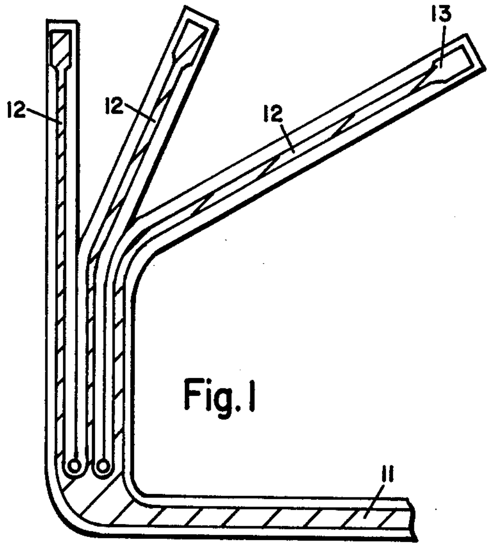
FIGURE 1 is a plan view of part of the circuit comprising the main conductor and a plurality of branch conductors extending therefrom.

More fully shown and described in my co-pending application is a harness for the wiring of an automotive dashboard wherein the conductors are encapsulated in a thermoplastic material and are flexible to be formed around the particular housing containing the circuits. These circuits are formed by laminating sheets of oxide coated copper foil to a base sheet of thermoplastic material etching away undesired portions of the foil with the remaining portions providing conductive paths between the various parts of the circuits and terminal portions which may be connected to electrical apparatus on the auto dashboard and to the electrical power supply. These conductive paths are flat and rectangular in cross section of uniform thickness and have a width proportional to the maximum electrical current to be carried thereby. The circuit shown in FIGURE 1 is a portion of one of these circuits wherein a main conductive path 11, having a plurality of branch conductors 12 which are integrally connected to main conductor 11 and divide out from the main conductor and extend therefrom to provide a predetermined circuit configuration. These branch conductors terminate in terminals integrally formed therewith and are somewhat enlarged to provide excellent contacting surfaces with suitable connectors. Generally these connectors are fully encapsulated by margins of thermoplastic material and are covered on both sides, such that the next step must be to remove part of the plastic to bare the copper foil for making an electrical connection.

Figure 2:
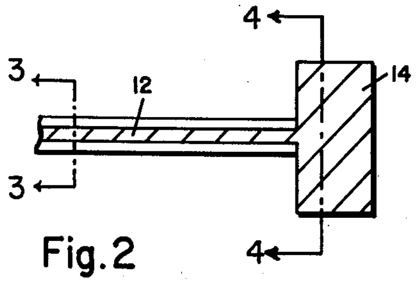
FIGURE 2 is a plan view of an unformed terminal structure used in the present invention.
Figure 3:
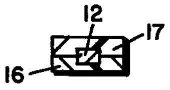
FIGURE 3 is a view in the cross section taken along the line 3—3 of FIGURE 2.
Figure 4:
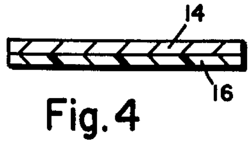
FIGURE 4 is a view in cross section taken along the line 4—4 of FIGURE 2.
Figure 5:
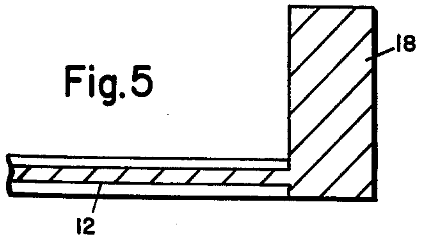
FIGURE 5 is a modified form of a terminal structure.

In FIGURE 2 there is shown an enlarged terminal 14 extending from the branch conductor 12. As shown in FIGURE 3 the branch conductor 12 is embedded between a base layer 16 and a top layer 17 of thermoplastic material suitably bonded together under heat and pressure. As shown in FIGURE 4 this enlarged terminal does not have the top cover applied thereto and is bonded only to the base 16. It is noted that the terminal 14 in FIGURE 2 is rectangular in shape and extends from both sides of the conductor 12. A modification of such a terminal is shown in FIGURE 5 wherein the rectangular extended portion extends from one side only of the conductor in the form of an L. Either configuration has been found satisfactory for the purpose intended and may have an exposed copper conductive surface across part of or all of its geometry.

Figure 6:
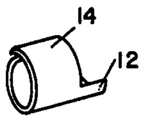
FIGURE 6 is a perspective view illustrating the formation of the terminal of FIGURE 2 into its final shape.

FIGURE 6 shows the enlarged terminal portions looped around to form a cylinder with the conductive exposed surface facing inwardly. This cylinder may be resilient or substantially self-supporting depending upon the elasticity of the thermoplastic material and the copper foil The inner diameter of this cylinder is preferably somewhat smaller than that of the stud connector to be fitted therein.

Figure 7:
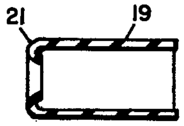
FIGURE 7 is a view in cross section of the elastic sleeve used to surround the terminal of FIGURE 2 after it has been shaped.

FIGURE 7 shows in cross section an elastic sleeve of thermoplastic material. This sleeve consists of a cylindrical wall 19 and an inwardly directed lip 21. In inserting the sleeve over the cylindrical terminal 14, the terminal is rolled in the manner shown in FIGURE 6 to a circumference smaller than that of the lip 21 so as to pass therethrough and into the cylinder.

Figure 8:
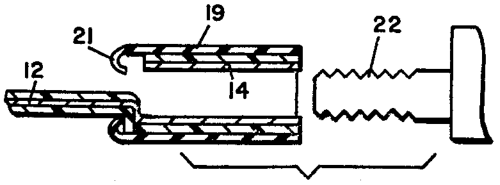
FIGURE 8 is a view of a longitudinal cross section of the completely formed terminal assembly, illustrating its use, and engaging a stud connector.

As shown in FIGURE 8 this terminal expands within the sleeve and is prevented from inadvertent withdrawal by engaging the lip 21 of the sleeve 14. The uninsulated surface of the terminal 14 engages and makes electrical contact with a stud connector 22 which is inserted therein.

The present invention represents an important step forward in the art of printed circuitry in that the resiliency and flexibility properties of plastic materials may be successfully utilized in combination with techniques of printed circuitry to produce electrical articles of superior characteristics. While there has been described preferred embodiments of this invention, it will be obvious to those skilled in the art that various changes and modifications may be made therein without departing from the invention and that it is therefore aimed in the appended claims to cover all such changes and modifications as fall fairly within the true spirit and scope of the invention.

What is claimed is:

1. An automotive dashboard wiring harness comprising a unitary flexible flat circuit having a planar main conductor of uniform thickness encapsulated within a plastic insulating material, said conductor being proportioned in width to the maximum current load, a plurality of branch conductors dividing out of and integrally formed with said main conductor and extending from said main conductor to provide a predetermined circuit configuration, said branch conductors having integral terminals thereon for use in making solderless connection to the electrical apparatus of said automotive dashboard, said terminals being elongated and bared on the upper surface and rolled into a cylindrical configuration, an elastic sleeve inserted thereover to yieldingly retain each said terminal in said cylindrical configuration, said sleeve having a rolled lip extending inwardly to retain said cylinder from inadvertent removal therefrom, said electrical apparatus having made connectors insertable within said cylinders to provide electrical contact with said conductors.

2. An automotive dashboard wiring harness comprising a unitary flexible flat circuit having a plurality of branch conductors, said branch conductors having integral terminals thereon for use in making solderless connection to the electrical apparatus of said automotive dashboard, said terminals being elongated and bared on the upper surface and rolled into a cylindrical configuration, an elastic sleeve inserted thereover to yieldingly retain each said terminal in said cylindrical configuration, said electrical apparatus having male connectors insertable within said cylinders to provide electrical contact with said conductor terminals.

3. A unitary flexible flat circuit having a planar main conductor of uniform thickness encapsulated within a plastic insulating material, said conductor being proportioned in width to the maximum current load, a plurality of branch conductors dividing out of and integrally formed with said main conductor and extending from said main conductor to provide a predetermined circuit configuration, said branch conductors having integral terminals thereon for use in making solderless connections to electrical apparatus, each of said terminals being of a cylindrical configuration and bared on its inner surface, an elastic sleeve inserted thereover to yieldingly retain said terminal in said cylindrical configuration, said sleeve having a rolled lip extending inwardly to retain said cylinder from inadvertent removal therefrom, said electrical apparatus having male connectors insertable within said cylindrical configuration to provide electrical contact with said bared inner surface.

4. An automotive dashboard wiring harness comprising a unitary flexible flat circuit having a planar main conductor of uniform thickness encapsulated within a plastic insulating material, said conductor being proportioned in width to the maximum current load, a plurality of branch conductors dividing out of and integrally formed with said main conductor and extending from said main conductor to provide a predetermined circuit configuration, said branch conductor having integral terminals thereon for use in making solderless connections and to the electrical apparatus of said automotive dashboard, each of said terminals being of an expandable cylindrical configuration and bared on its inner surface, said electrical apparatus having male connectors insertable within said cylindrical configuration to provide electrical contact with said conductors.

No references cited.